United States Patent
Schoen et al.

(10) Patent No.: US 12,282,715 B2
(45) Date of Patent: *Apr. 22, 2025

(54) MULTI-LEVEL WELL DESIGN VALIDATOR

(71) Applicant: Schlumberger Technology Corporation, Sugar Land, TX (US)

(72) Inventors: Eric Jonathan Schoen, Bellaire, TX (US); Lucian Johnston, Sugar Land, TX (US); Mark S. Passolt, Hansville, WA (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 435 days.

This patent is subject to a terminal disclaimer.

(21) Appl. No.: 17/650,920

(22) Filed: Feb. 14, 2022

(65) Prior Publication Data

US 2022/0164497 A1    May 26, 2022

Related U.S. Application Data

(63) Continuation of application No. 16/792,828, filed on Feb. 17, 2020, now Pat. No. 11,250,188, which is a
(Continued)

(51) Int. Cl.
*G06F 30/20* (2020.01)
*E21B 41/00* (2006.01)
*E21B 49/00* (2006.01)

(52) U.S. Cl.
CPC .............. *G06F 30/20* (2020.01); *E21B 41/00* (2013.01); *E21B 49/00* (2013.01)

(58) Field of Classification Search
CPC ...... E21B 41/00; E21B 41/0092; E21B 47/00; E21B 49/00; G06F 30/20
(Continued)

(56) References Cited

U.S. PATENT DOCUMENTS

2008/0244418 A1* 10/2008 Manolescu ............ G06Q 10/00
                                                                           715/753
2010/0191516 A1    7/2010 Benish et al.
(Continued)

FOREIGN PATENT DOCUMENTS

WO        2014100613 A1    6/2014

OTHER PUBLICATIONS

International Search Report and Written Opinion for the counterpart International patent application PCT/US2015/039856 mailed on Sep. 22, 2015.
(Continued)

*Primary Examiner* — Andre Pierre Louis
(74) *Attorney, Agent, or Firm* — Jeffrey D. Frantz

(57) ABSTRACT

A method for designing a well, including: determining a first well construction discipline for a first participant and an authority level for the first participant within the first well construction discipline; obtaining a plurality of rules corresponding to the first well construction discipline and the authority level for the first participant within the first well construction discipline; operating, based on the plurality of rules, an interface that restricts decision options for the first participant; receiving a decision associated with the well and based on the interface from the first participant; and updating a design of the well based on the decision.

18 Claims, 8 Drawing Sheets

Related U.S. Application Data continuation of application No. 15/324,774, filed as application No. PCT/US2015/039856 on Jul. 10, 2015, now Pat. No. 10,592,620.

(60) Provisional application No. 62/023,653, filed on Jul. 11, 2014.

(58) Field of Classification Search
USPC .................................................. 703/9, 10
See application file for complete search history.

(56)     References Cited

U.S. PATENT DOCUMENTS

| | | | |
|---|---|---|---|
| 2011/0161133 A1 | 6/2011 | Staveley et al. | |
| 2012/0123756 A1 | 5/2012 | Wang et al. | |
| 2012/0285701 A1 | 11/2012 | Cheng et al. | |
| 2013/0311147 A1* | 11/2013 | Greenwood | G06F 30/00 703/1 |
| 2014/0033265 A1* | 1/2014 | Leeds | G06F 21/10 726/1 |

OTHER PUBLICATIONS

International Preliminary Report on Patentability for the counterpart International patent application PCT/US2015/039856 mailed on Jan. 26, 2017.
Office Action for the counterpart Norwegian patent application 20170100 mailed on Mar. 18, 2020, 4 pages.

* cited by examiner

MULTI-LEVEL WELL DESIGN VALIDATOR

CROSS-REFERENCE TO RELATED APPLICATIONS

This application is a continuation application of U.S. patent application Ser. No. 16/792,828 filed on 17 Feb. 2020, which is a continuation application of U.S. patent application Ser. No. 15/324,771 filed on 9 Jan. 2017 under the National Phase of International Patent Application Number PCT/US2015/039856 filed on 10 Jul. 2015 which claims priority under 35 U.S.C. § 119(e) to U.S. Provisional Application Ser. No. 62/023,653, filed on 11 Jul. 2014 the specifications of which are incorporated by reference in their entirety.

BACKGROUND

Hydrocarbon fluids such as oil and natural gas are obtained from a subterranean geologic formation, referred to as a reservoir, by drilling a well that penetrates the hydrocarbon-bearing formation. Before drilling the well, it is necessary to complete a design for the well and the design process usually involves multiple participants. Once the wellbore is drilled, various forms of well completion components may be installed to control and enhance the efficiency of producing various fluids from the reservoir.

SUMMARY

In general, in one aspect, embodiments are related to a method for designing a well. The method comprises: determining a first well construction discipline for a first participant and an authority level for the first participant within the first well construction discipline; obtaining a plurality of rules corresponding to the first well construction discipline and the authority level for the first participant within the first well construction discipline; operating, based on the plurality of rules, an interface that restricts decision options for the first participant; receiving a decision associated with the well and based on the interface from the first participant; and updating a design of the well based on the decision.

In general, in one aspect, embodiments are related to a system for designing a well. The system comprises: an authority level repository storing a plurality of rules associated with a plurality of well construction disciplines and a plurality of authority levels; a design repository storing a design of the well; and a workflow engine configured to: obtain a subset of the plurality of rules corresponding to a well construction discipline of a participant and an authority level for the participant within the well construction discipline; generate, based on the subset of the plurality of rules, an interface that restricts decision options for the participant; receive a decision associated with the design of the well and based on the interface from the participant; and update the design of the well based on the decision.

In general, in one aspect, embodiments are related to a non-transitory computer-readable medium (CRM) storing instructions for designing a well. The instructions comprise functionality to: determine a well construction discipline for a participant and an authority level for the participant within the well construction discipline; obtain a plurality of rules corresponding to the well construction discipline and the authority level for the participant within the well construction discipline; operate, based on the plurality of rules, an interface that restricts decision options for the participant; receive a decision associated with the well and based on the interface from the participant; and update a design of the well based on the decision.

Other aspects of the technology will be apparent from the following description and the appended claims.

BRIEF DESCRIPTION OF DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Figure 1:
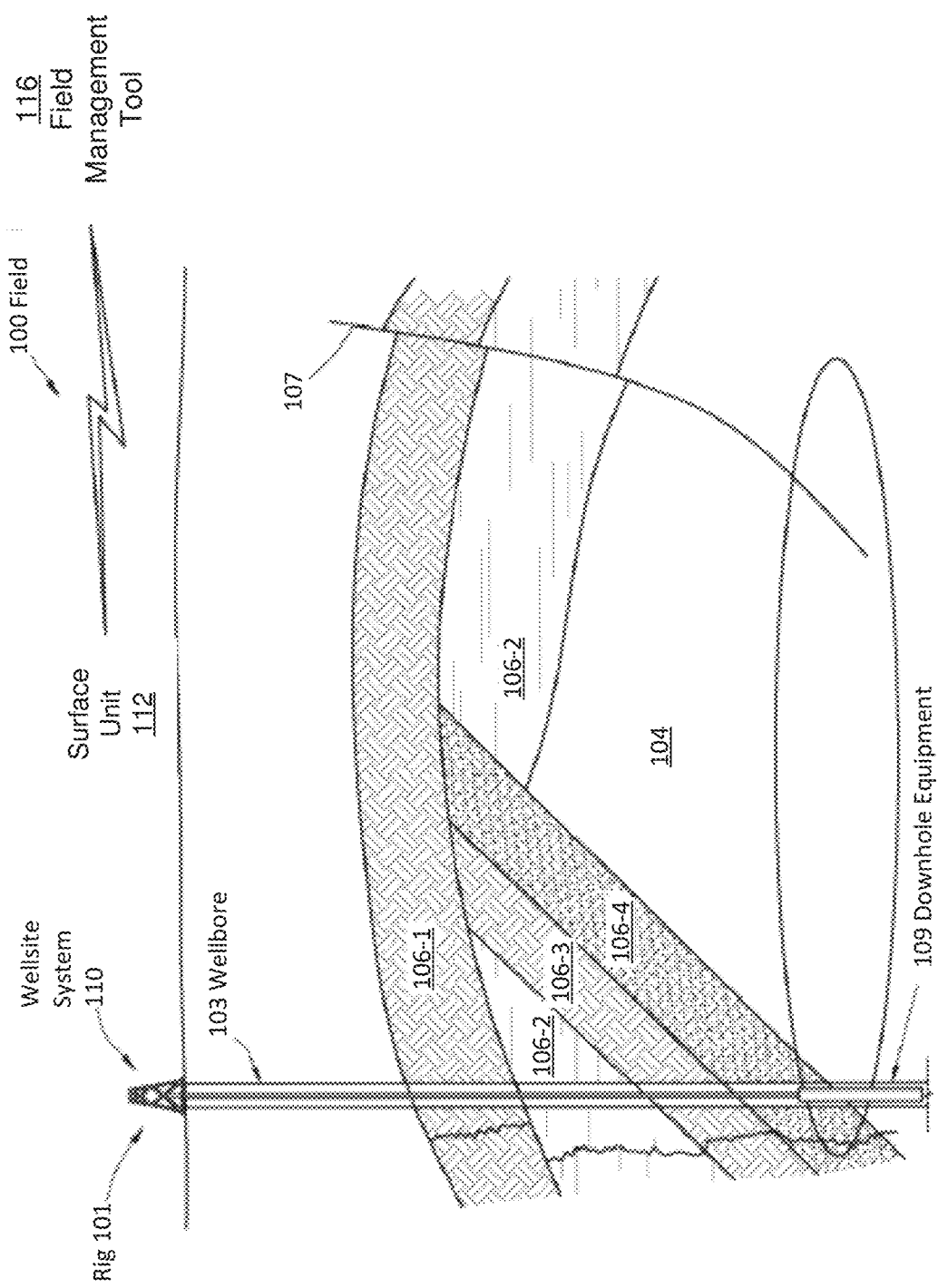
FIGS. 1 and 2 show schematic diagrams in accordance with one or more embodiments.

Specific embodiments of the technology will now be described in detail with reference to the accompanying figures. Like elements in the various figures are denoted by like reference numerals for consistency.

In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of this detailed disclosure include a method, a system, and a non-transitory computer readable medium for designing a well. In particular, each participant (e.g., a person, an algorithm) involved in the designing of the well is associated with a well construction discipline and an authority level within the well construction discipline. The well construction discipline and authority level attributes restrict the decision options that are available to the participant during the designing of the well. This ensures that the decisions affecting cost, viability, safety, etc. of the well design and well are made by the appropriate participants having the necessary competency and skill set.

FIG. 1 depicts a schematic view, partially in cross section, of a field (100) in which one or more embodiments may be implemented. In one or more embodiments, the field may be an oilfield. In other embodiments, the field may be a different type of field. In one or more embodiments, one or more of the modules and elements shown in FIG. 1 may be omitted, repeated, and/or substituted. Accordingly, embodiments should not be considered limited to the specific arrangements of modules shown in FIG. 1.

A subterranean formation (104) is in an underground geological region. An underground geological region is a geographic area that exists below land or ocean. In one or more embodiments, the underground geological region includes the subsurface formation in which a borehole is or may be drilled and any subsurface region that may affect the drilling of the borehole, such as because of stresses and strains existing in the subsurface region. In other words, the underground geological region may not only include the area immediately surrounding a borehole or where a borehole may be drilled, but also any area that affects or may affect the borehole or where the borehole may be drilled.

As shown in FIG. 1, the subterranean formation (104) may include several geological structures (106-1 through 106-4) of which FIG. 1 provides an example. As shown, the formation may include a sandstone layer (106-1), a limestone layer (106-2), a shale layer (106-3), and a sand layer (106-4). A fault line (107) may extend through the formation. In one or more embodiments, various survey tools and/or data acquisition tools are adapted to measure the formation and detect the characteristics of the geological structures of the formation. Further, as shown in FIG. 1, the wellsite system (110) is associated with a rig (101), a wellbore (103), and other field equipment and is configured to perform wellbore operations, such as logging, drilling, fracturing, production, or other applicable operations. The wellbore (103) may also be referred to as a borehole.

In one or more embodiments, the surface unit (112) is operatively coupled to a field management tool (116) and/or the wellsite system (110). In particular, the surface unit (112) is configured to communicate with the field management tool (116) and/or the wellsite system (110) to send commands to the field management tool (116) and/or the wellsite system (110) and to receive data therefrom, including data from survey tools and/or data acquisition tools. For example, the wellsite system (110) may be adapted for measuring downhole properties using logging-while-drilling ("LWD") tools to obtain well logs and for obtaining core samples. These downhole properties and data from survey tools and/or data acquisition tools may be used to design wells. In one or more embodiments, the surface unit (112) may be located at the wellsite system (110) and/or remote locations. The surface unit (112) may be provided with computer facilities for receiving, storing, processing, and/or analyzing data from the field management tool (116), the wellsite system (110), or another part of the field (100). The surface unit (112) may also be provided with or functionally for actuating mechanisms at the field (100). The surface unit (112) may then send command signals to the field (100) in response to data received, for example, to control and/or optimize various field operations described above.

During the various oilfield operations at the field, data is collected for analysis and/or monitoring of the oilfield operations. Such data may include, for example, subterranean formation, equipment, historical and/or other data. Static data relates to, for example, formation structure and geological stratigraphy that define the geological structures of the subterranean formation. Static data may also include data about the wellbore, such as inside diameters, outside diameters, and depths. Dynamic data relates to, for example, fluids flowing through the geologic structures of the subterranean formation over time. The dynamic data may include, for example, pressures, fluid compositions (e.g. gas oil ratio, water cut, and/or other fluid compositional information), choke positions of down hole flow control valves, and other information that may be monitored via downhole equipment (109) such as downhole sensors. The downhole sensors may include sensors which are part of the down hole flow control valves and sensors, e.g. pressure and temperature sensors, which are located separately in the various well zones and/or other well locations.

The static and dynamic data collected from the wellbore and the oilfield may be used to create and update a three dimensional model of the subsurface formations. Additionally, static and dynamic data from other wellbores or oilfields may be used to design a well. Hardware sensors, core sampling, and well logging techniques may be used to collect the data. Other static measurements may be gathered using downhole measurements, such as core sampling and well logging techniques. Well logging involves deployment of a downhole tool into the wellbore to collect various downhole measurements, such as density, resistivity, etc., at various depths. Such well logging may be performed using, for example, a drilling tool and/or a wireline tool, or sensors located on downhole production equipment. Once the well is formed and completed, fluid flows to the surface using production tubing and other completion equipment. As fluid passes to the surface, various dynamic measurements such as fluid flow rates, pressure, and composition may be monitored. These parameters may be used to determine various characteristics of the subterranean formation.

In one or more embodiments, the data is received by the surface unit (112), which is communicatively coupled to the field management tool (116). Generally, the field management tool (116) is configured to analyze, model, control, optimize, or perform other management tasks of the aforementioned field operations based on the data provided from the surface unit (112). Although the surface unit (112) is shown as separate from the field management tool (116) in FIG. 1, in other examples, the surface unit (112) and the field management tool (116) may also be combined.

In the vertical well shown in FIG. 1, a lateral of the vertical well is the borehole. Although FIG. 1 shows a vertical well, one or more embodiments may apply to a horizontal well and/or a multilateral well that extends horizontally through one or more subsurface formations. For example, in a horizontal well, the lateral may correspond to the single borehole trajectory. The single lateral of the horizontal or vertical well may have multiple zones isolated by packers and down hole flow control valves. In a multilateral well, multiple laterals may exist.

Figure 2:
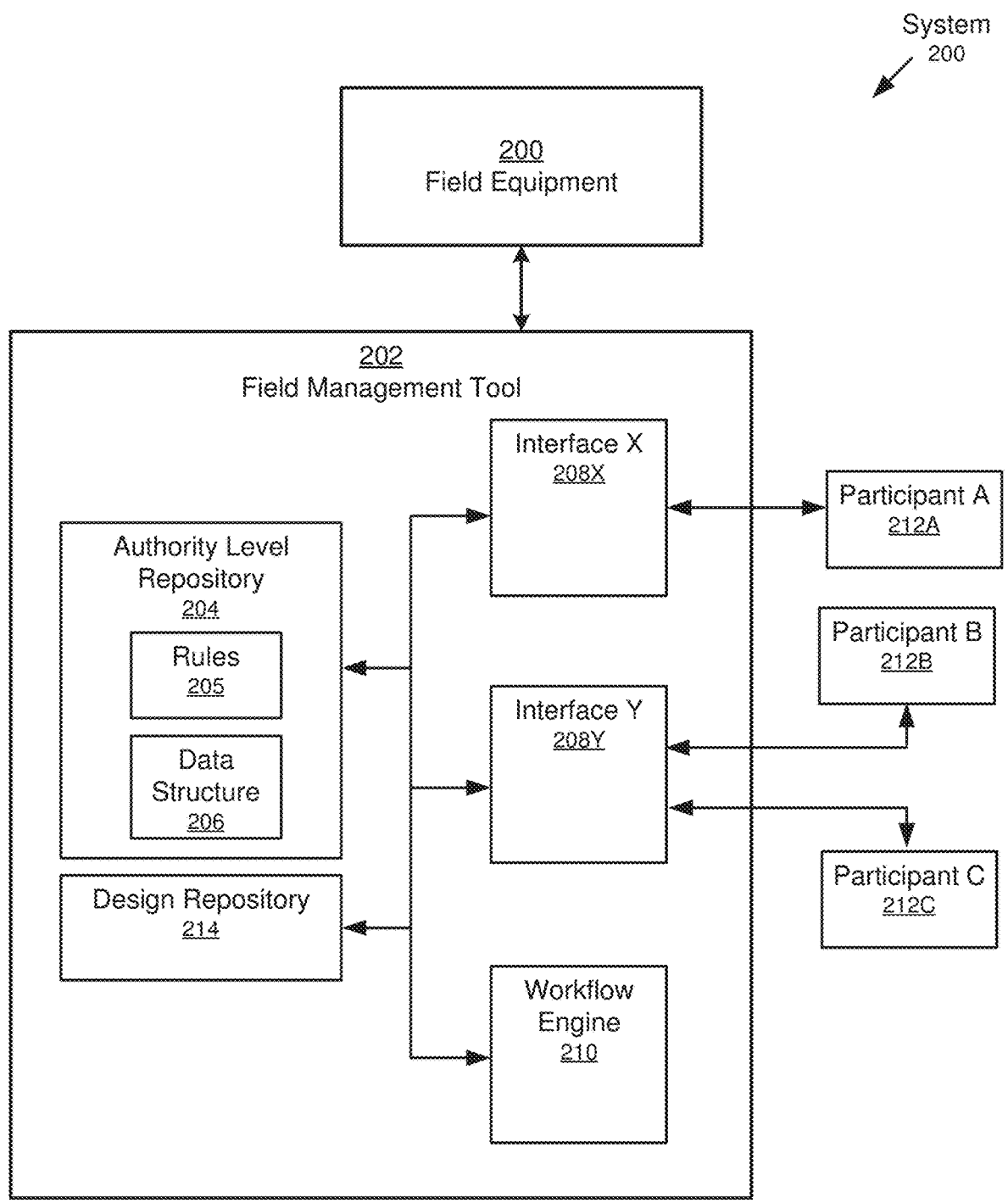

FIG. 2 shows a schematic diagram of a system in accordance with one or more embodiments of the technology. In FIG. 2, lines represent operable connections between components. In other words, the operable connections represent at least some of the components that may share data and commands. The operable connections may be direct or indirect, through a network, through shared storage, through application programming interface calls, intermittent or semi-permanent, or through any other type of connection. As shown in FIG. 2, field equipment (200) is operatively connected to a field management tool (202). The field equipment (200) may correspond to any of the hardware and other equipment discussed above with reference to FIG. 1 (e.g., sensors, survey tools, data acquisition tools, etc.). The field management tool (202) may correspond to the field management tool (116) discussed above with reference to FIG. 1. While the field management tool (202) is described in use with various activities relating to drilling in FIG. 1, the field management tool (202) may further be used with respect to various activities in preparation to drilling, e.g., surveying a possible wellsite, designing a well, etc. Thus, the field management tool (202) may be used with respect to activities performed prior to actual drilling, including the designing of a well.

As shown in FIG. 2, the field management tool (202) includes an authority level repository (204), a design repository (214), one or more interfaces (i.e., Interface X (208X), Interface Y (208Y)), and a workflow engine (210). The field management tool (202) may be used to generate a well design for a well to be constructed in a field (e.g., field (100) discussed above in reference to FIG. 1). Multiple participants (i.e., Participant A (212A), Participant B (212B), Participant C (212C), etc.) are involved in designing the well. Each participant (212A, 212B, 212C) may correspond to an individual or an algorithm executing on a computing device (not shown). Each of the components are discussed below.

In one or more embodiments, the design repository (214) corresponds to hardware, software, firmware, or a combination thereof that includes functionality to store data elements involved in the designing of a well. Each data element may correspond to a design decision made by a participant and/or decision options or data made available to participants to make decisions regarding the well under design. A decision made by one participant may be a decision option for another participant. Example data items include maps, survey results, logs, graphs, equations, models, sensor readings, technical specifications, blueprints, one or more partially completed designs of the well or any part of the well, numerical ranges, etc. Example data elements may also include decisions regarding specific parts or fluids to be used in the well, parameterized designs to be used in the well, numerical values for parameters (e.g., deviation angles, kickoff depth, etc.) in parameterized designs, validations (e.g., sign-offs) regarding any aspect of the well design, etc.

In one or more embodiments, many well construction disciplines are involved in the design of a well. Example well construction disciplines include trajectory, casing, fluid, bit, risk, cement planning, bottom hole assembly (BHA) design, etc. In one or more embodiments, within each well construction discipline, there exists different authority levels including, for example, selector, builder, validator, coherency checker, designer, and optimizer. In other words, there is a hierarchy of authority levels. An authority level restricts the decision options that are available to a participant when making decisions regarding the well design (discussed below). An authority level may have all the decision options that are available to lower (i.e., more restrictive) authority levels in the hierarchy. Each of these authority levels is discussed below.

"Selector" may refer to a level of authority that may choose an engineering decision from a predetermined list of possible decisions. "Builder" may refer to a level of authority that may create an engineering decision by configuring aspects of that decision from constituent parts. For example, the builder may create an engineering assembly by selecting sub-assembly parts, and the sub-assembly parts may be chosen from predetermined lists of possible sub-assemblies. In another embodiment, the "Builder" may create an engineering decision by specifying the values of parameters in a parameterized design. The parameters to such a design may be pre-constrained to a set or range of acceptable values.

"Validator" may refer to a level of authority that may perform an analysis of design decisions within a single discipline of oil well design, to validate the design against the parameters and constraints of the drilling opportunity. "Coherency Checker" may refer to a level of authority that may perform an analysis of design decisions within multiple disciplines of oil well design, to validate the design against the parameters and constraints of the drilling opportunity. "Designer" refers to a level of authority that may create a new engineering decision by assembling or parameterizing parts in a fully or partially unconstrained manner "Optimizer" refers to a level of authority that may modify multiple decisions in an engineered system to optimize its performance, safety, reliability, cost, or other quality measure, while not violating engineering constraints imposed by equipment limitations, operating rules, or by the environment.

Together, a well construction discipline and an authority level within the well construction discipline form an attribute pair that may be assigned to the participants. For example, a participant may be a selector within the fluid well construction discipline. Multiple attribute pairs may be assigned to one participant. For example, a participant may be both a validator within the trajectory well construction discipline, and a builder in the casing well construction discipline.

In one or more embodiments, the authority level repository (204) corresponds to hardware, software, firmware, or a combination thereof that includes functionality to store rules (205). Each of the rules (205) corresponds to a well construction discipline and authority level attribute pair. There may be multiple rules per attribute pair. Additionally, a rule may apply to multiple attribute pairs. The rules (205) may specify what decision options regarding the well design are available to a participant assigned the corresponding attribute pair. Additionally or alternatively, the rules (205) may specify the decision options that are not available (e.g., restrictions, constraints, etc.) to a participant assigned the corresponding attribute pair. The decision options may correspond to elements that can be selected by the participant. Additionally or alternatively, the decision options may correspond to numerical ranges (e.g., ±5%) that limit participant decisions (i.e., participant input must fall within the numerical range) and/or may correspond to the types of decisions (e.g., selections, validations, parameter values, etc.) that can be made by the participant. Additionally or alternatively, the rules (205) may specify which data elements in the design repository (214) should be made accessible (e.g., viewable) to the participant assigned the corresponding attribute pair in order to make a design decision.

In one or more embodiments, the authority level also has functionality to store a data structure (206). The data structure (206) may correspond to a matrix, a linked-list, a database, etc. The data structure (206) may store the relationships/links/interconnections between the well construction disciplines and the authority levels. Further, although shown as separate components in FIG. 2, in some embodiments the data structure (206) stores the rules (205). Further still, the data structure (206) may store the well construction discipline and authority level attribute pair(s) assigned to each participant.

Figure 3:
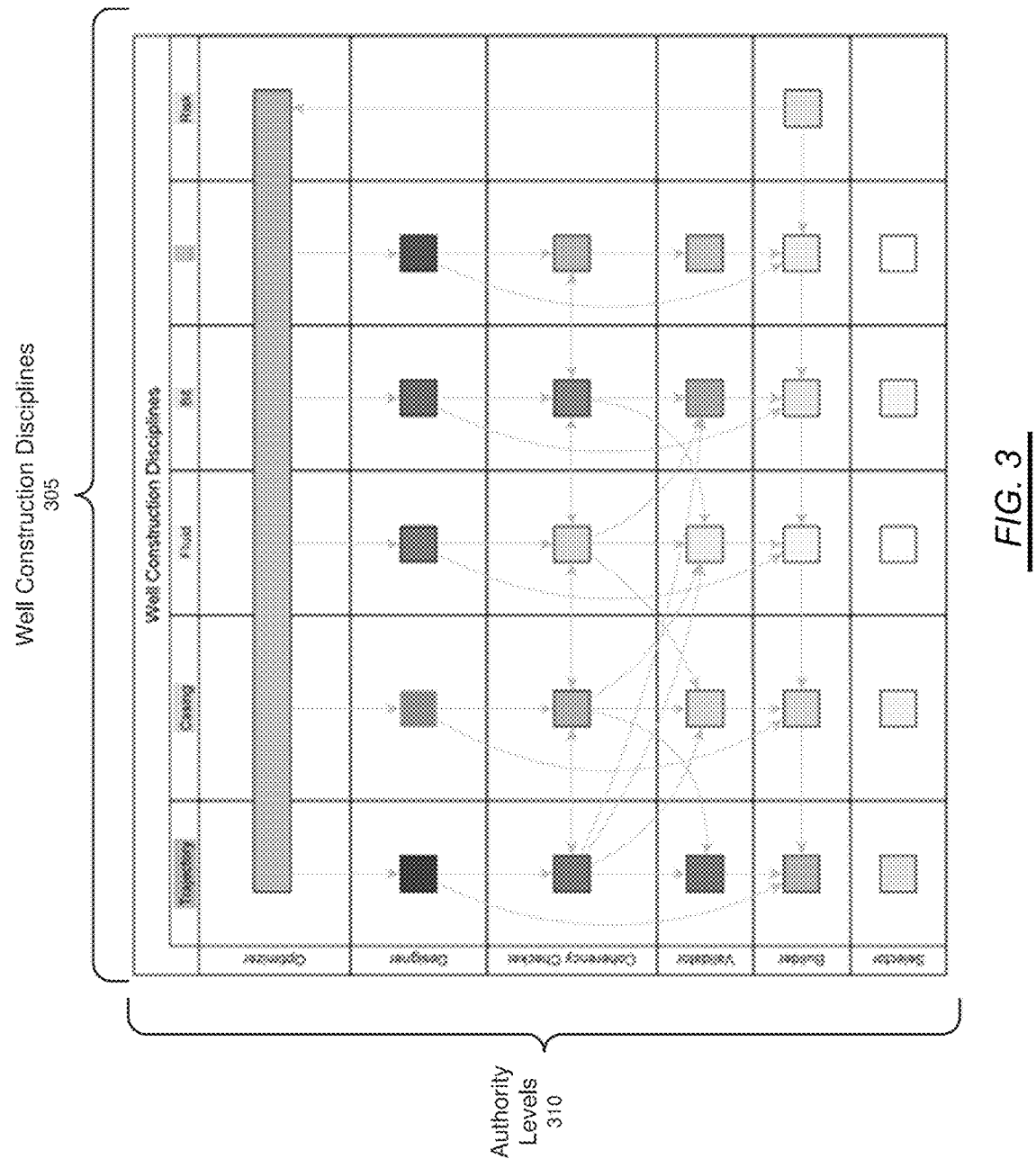
FIG. 3 shows a matrix in accordance with one or more embodiments.

FIG. 3 shows a matrix (300) in accordance with one or more embodiments. The matrix (300) may correspond to the data structure (206) discussed above in reference to FIG. 2. As shown in FIG. 3, one dimension of the matrix (300) corresponds to well construction disciplines (305). Another dimension of the matrix (300) corresponds to authority levels (310). In one or more embodiments, each entry (i.e., an intersection of a row and column) in the matrix (300)

corresponds to a well construction discipline and authority level attribute pair. Each entry may store the identity of a participant assigned the attribute pair. Each entry may store one or more rules corresponding to the attribute pair. Each entry may specify a relationship/link/interconnect between the attribute pair and another attribute pair.

Referring back to FIG. 2, the field management tool (202) has one or more interfaces (208X, 208Y). The interfaces (208X, 208Y) are used to provide (e.g., present, display) data elements (e.g., decision options and/or data to make decisions) to participants (212A, 212B, 212C) and collect data elements (e.g., decisions) from the participants. There may be one interface per participant. Additionally or alternatively, multiple participants may share the same interface. An interface (208X, 208Y) may be located on a different computing device than the repositories (204, 214). When the participant is an individual, the interface (208X, 208Y) may be a graphical user interface (GUI) with various GUI widgets including, for example, radio buttons, drop-down boxes, tabs, sliders, text boxes, lists, etc. When the participant is an algorithm configured to automate some aspect of well design, the interface may be an application programming interface (API) or any type of messaging platform to exchanges messages, send commands, and receive output (e.g., selected or calculated values) from the participant.

In one or more embodiments, the field management tool (202) includes the workflow engine (210). The workflow engine (210) corresponds to hardware, software, firmware, or a combination thereof that includes functionality to obtain rules corresponding to an attribute pair of a participant (212A, 212B, 212C); operate, based on the rules, an interface (208X, 208Y) that restricts decision options for the participant (212A, 212B, 212C); receive a decision associated with the design of the well from the participant (212A, 212B, 212C) using the interface (208X, 208Y); and update the design of the well based on the decision. The workflow engine (210) may repeatedly perform these functions at each stage in the workflow to design the well. At each stage, decisions may be required from one or more participants.

As discussed above, rules corresponding to an attribute pair may specify the decision options that are available (or not available) to the participant assigned the attribute pair. As also discussed above, the design options may correspond to elements that can be selected by the participant. Additionally or alternatively, the decision options may correspond to numerical ranges (e.g., ±5%) that limit participant decisions and/or may correspond to the types of decisions (e.g., selections, validations, parameter values, etc.) that can be made by the participant. In one or more embodiments, the workflow engine (210) operates an interface based on the rules. Specifically, the workflow engine configures the interface to restrict the decision options made available to the participant to those permitted by the rule(s) for the attribute pair assigned to the participant. This is done to ensure the participant can only make decisions regarding the well design that are within the participant's skill set and competency level.

In one or more embodiments, when the participant is an individual, configuring the interface to restrict the decision options includes modifying the GUI widgets such that the participant can only select one of the elements permitted by the rule(s). Such modifications may include enabling or disabling one or more of the GUI widgets; increasing or reducing the number of radio buttons; prepopulating drop-down lists with elements from which the participant must choose (i.e., the participant cannot make a selection that is not in the drop-down list); etc. Additionally or alternatively, configuring the interface to restrict the decision options may also include modifying textboxes and/or sliders to prevent the participant from providing input (i.e., a decision) that falls outside the numerical ranges or types permitted by the rule(s). Additionally or alternatively, configuring the interface to restrict the decision options may also include populating the GUI only with the data elements needed by the participant to make the decision.

For example, when the authority level is "builder", the GUI may include a parameterized design, and the decision may be a specification of a parameter value for the parameterized design.

As another example, when the authority level is "selector", the GUI may include a plurality of engineering decisions (e.g., within a drop-down box), and the decision is a selection of an engineering decision.

As another example, when the authority level is "validator", the GUI may include a design decision (e.g., made by a previous participant), and the decision from the participant is a validation of the design decision.

As another example, when the authority level is "coherency checker", the GUI may include a design decision within multiple well construction disciplines, and the decision from the participant is a validation of the design decision.

As yet another example, when the authority level is "designer", the GUI includes a broad range of capabilities (e.g., a canvas on which the participant can blueprint or model one or more aspects of the well), and the decision is at least one of the capabilities (e.g., the blueprint created by the participant).

In one or more embodiments, when the participant is an algorithm, operating the interface may include providing the algorithm with a fixed number of values from which the algorithm must select, restricting the number and type of inputs that are provided to the algorithm, etc.

In one or more embodiments, the workflow engine (210) collects the decision from the interface after the decision has been made by the participant. As discussed above, the decision may take on many forms. The decision may correspond to specific parts or fluids to be used, parameterized designs to be used, numerical values for parameters (e.g., deviation angles, kickoff depth, etc.) in parameterized designs, validations (e.g., sign-offs) regarding any aspect of the well design, etc. The workflow engine (210) may update the well design based on the decision. For example, the workflow engine (210) may add the decision as a data item to the design repository, where it can be viewed by other participants. Future decisions by the same or different participants may be made based on the collected decision (i.e., data item).

Although FIG. 2 shows the participants as being external to the field management tool (202), in one or more embodiments, at least one of the participants is an algorithm executing on the field management tool (202).

Figure 4:
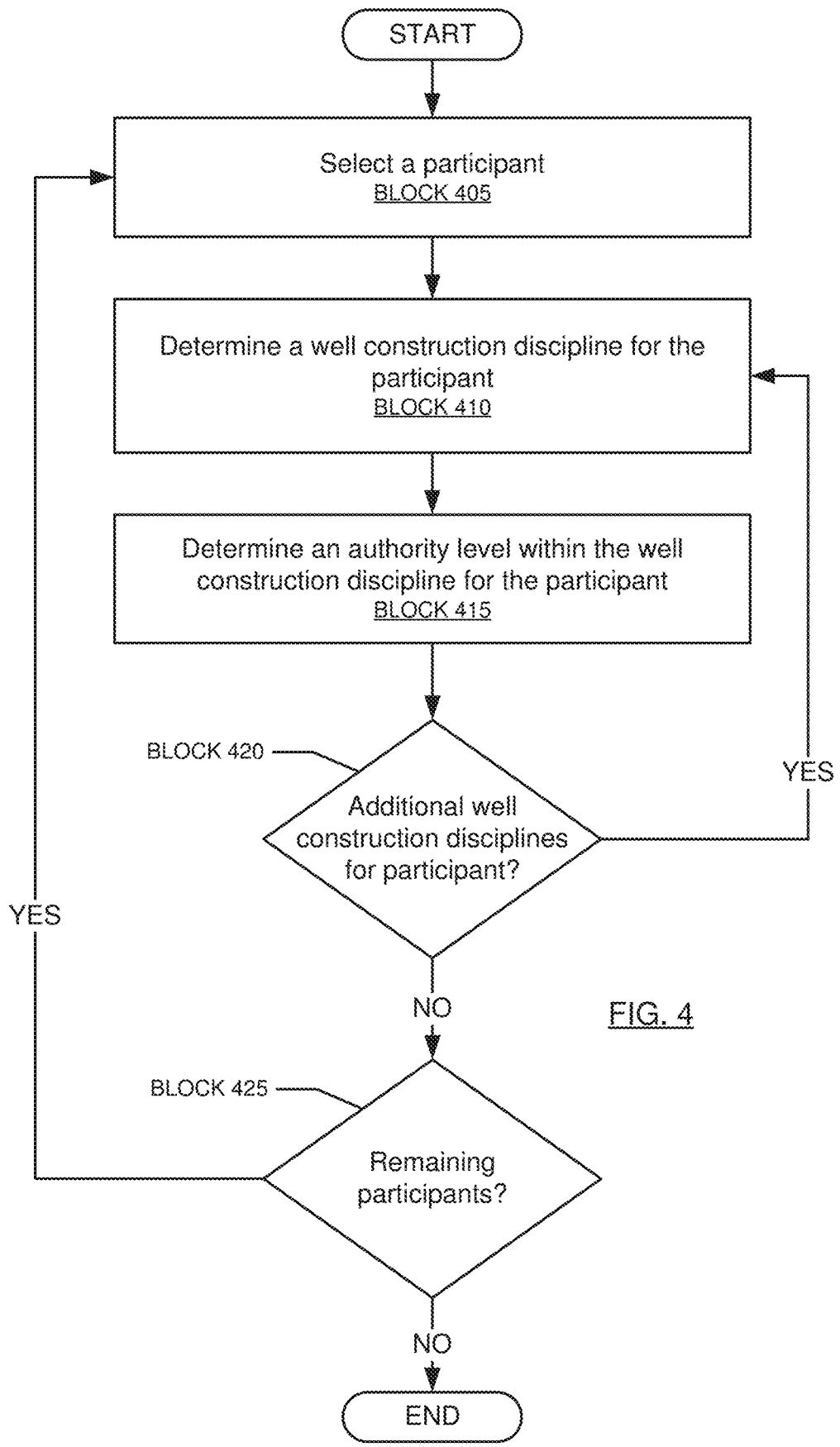
FIGS. 4 and 5 show flowcharts in accordance with one or more embodiments of the technology.

FIG. 4 shows a flowchart in accordance with one or more embodiments. The flowchart depicts a process for assigning attribute pairs to participants. One or more of the blocks in FIG. 4 may be performed by the components of the field management tool (202), discussed above in reference to FIG. 2. In one or more embodiments, one or more of the blocks shown in FIG. 4 may be omitted, repeated, and/or performed in a different order than the order shown in FIG. 4. Accordingly, the scope of the disclosure should not be considered limited to the specific arrangement of blocks shown in FIG. 4.

Initially, a participant is selected (Block 405). The participant may be selected by a system administrator or a project manager for the well design project. The participant may be selected from a list of participants that is compiled from previous well design projects. The participant may be selected from a list of participants that is compiled from a personnel database. The participant may be selected from a list of software applications or algorithms that are installed and available for execution.

In Block 410, a well construction discipline is determined for the participant. As discussed above, example well construction disciplines include trajectory, casing, fluid, bit, risk, cement planning, etc. The well construction discipline for the participant may be extracted from the records of previous projects that included the participant. The well construction discipline for the participant may be extracted from a credentials database. The well construction discipline for the participant may be selected manually by the system administrator or the project manager, etc. The well construction discipline may be selected based on technical specifications provided by the manufacturer of the software.

In Block 415, an authority level within the well construction discipline is determined for the participant. As discussed above, within each well construction discipline, there exists different authority levels including, for example, selector, builder, validator, coherency checker, designer, and optimizer. An authority level restricts the decision options that are available to a participant regarding the well design. The authority level for the participant may be extracted from the records of previous projects including the participant. The authority level for the participant may be extracted from a credentials database. The authority level for the participant may be selected manually by the system administrator or the project manager, etc. The authority level may be selected/extracted from technical specifications provided by the manufacturer of the software.

As discussed above, the well construction discipline and the authority level within the well construction discipline form an attribute pair. This attribute pair is assigned to the participant. Assigning the attribute pair may include adding the attribute pair to a profile of the participant in a repository associated with the well design project.

In Block 420, it is determined whether another well construction discipline may be assigned to the participant. As discussed above, multiple attribute pairs may be assigned to a single participant. For example, a participant may be both a validator within the trajectory well construction discipline, and a builder in the casing well construction discipline. If additional well construction disciplines may be assigned to the participant, the process returns to Block 410. If no additional well construction disciplines need to be assigned to the participant, the process proceeds to Block 425.

In Block 425, it is determined whether additional participants remain that have not been assigned an attribute pair. When it is determined that additional participants remain, the process returns to Block 405. When it is determined that all participants have been assigned attribute pairs, the process may end.

As discussed above, a data structure (e.g., matrix) may be used to store the attribute pairs assigned to the participants. For example, the dimensions of the matrix may correspond to well construction disciplines and authority levels. The entries of the matrix, each representing a well construction discipline and an authority level within the well construction discipline, may store the identities of the participants assigned the corresponding well construction discipline and authority level.

Figure 5:
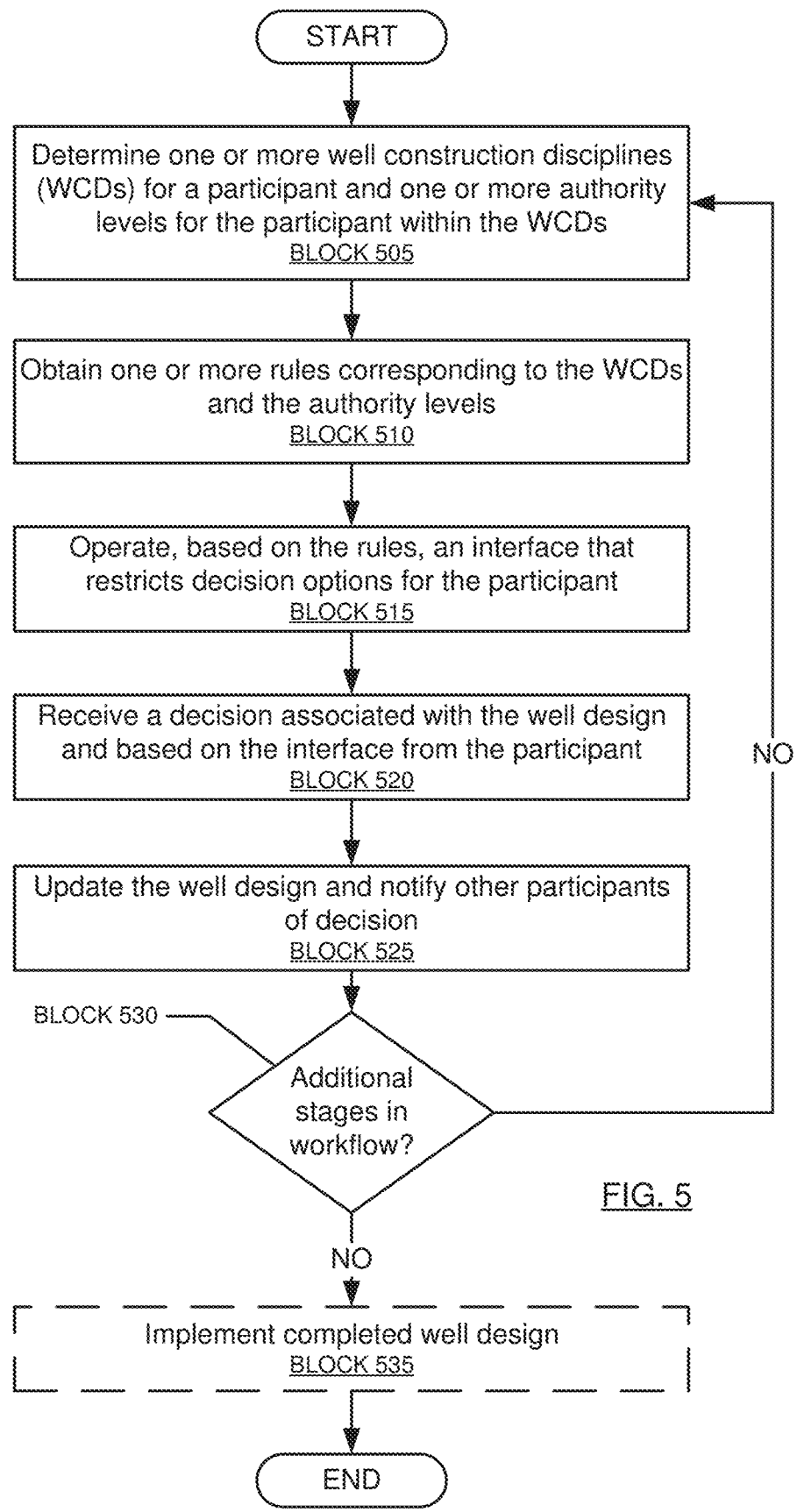

FIG. 5 shows a flowchart in accordance with one or more embodiments. The flowchart depicts a process for designing a well. One or more of the blocks in FIG. 5 may be performed by the components of the field management tool (202), discussed above in reference to FIG. 2. In one or more embodiments, one or more of the blocks shown in FIG. 5 may be omitted, repeated, and/or performed in a different order than the order shown in FIG. 5. Accordingly, the scope of the disclosure should not be considered limited to the specific arrangement of blocks shown in FIG. 5.

Initially, at least one well construction discipline and an authority level within the well construction discipline are determined for the participant (Block 505). This attribute pair may be determined when the participant logs into the system (e.g., when the participant is an individual) or when the participant sends a status message (e.g., when the participant is an algorithm) to work towards completing a stage of the well design workflow. This attribute pair may be determined by prompting the participant to provide his/her well construction discipline and authority level within the well construction discipline. Additionally or alternatively, the at least one well construction discipline and the authority level within the well construction discipline may be determined by accessing an existing data structure storing the attribute pairs assigned to participants, and searching for the participant.

In Block 510, one or more rules corresponding to the participant's well construction discipline and authority level within the well construction discipline are obtained. As discussed above, rules corresponding to an attribute pair may specify the decision options that are available (or not available) to the participant assigned the attribute pair. As also discussed above, the design options may correspond to elements that can be selected by the participant. Additionally or alternatively, the decision options may correspond to numerical ranges (e.g., ±5%) that limit participant decisions and/or may correspond to the types of decisions (e.g., selections, validations, parameter values, etc.) that can be made by the participant.

In Block 515, an interface is operated based on the rules. Specifically, the interface is configured to restrict the decision options made available to the participant to those permitted by the rule(s) for the attribute pair assigned to the participant. This is done to ensure the participant can only make decisions regarding the well design that are within the participant's skill set and competency level. The interface is used to provide (e.g., present, display) data elements (e.g., decision options) to the participant and collect data elements (e.g., decisions) from the participant. When the participant is an individual, the interface may be a GUI with various GUI widgets. When the participant is an algorithm configured to automate some aspect of well design, the interface may be an application programming interface (API) or any type of messaging platform to exchanges messages, send commands, and receive output (e.g., selected or calculated values) from the participant.

In Block 520, a decision associated with well design is received from the interface. The participant may make the decision by manipulating one or more of the GUI widgets. Additionally or alternatively, the decision may be a value selected or calculated by the participant (e.g., when the participant is an algorithm) The decision may take on many forms, including decisions regarding specific parts or fluids to be used, parameterized designs to be used, numerical values for parameters (e.g., deviation angles, kickoff depth, etc.) in parameterized designs, validations (e.g., sign-offs) regarding any aspect of the well design, etc.

In Block 525, the well design is updated with the decision collected from the interface. For example, the decision may be added as a data item to a design repository, where it can be viewed by other participants. Future decisions by the same or different participants may be made based on the collected decision (i.e., data item). One or more notifications may be sent to other participants. The notifications may include the decision or indicate that a decision has been made.

In Block 530, it is determined whether there exists additional stages in the workflow to design the well. As discussed above, each stage may require decisions from one or more participants. When it is determined that additional stages remain (e.g., the well design is not yet completed) or the current stage is not yet completed, the process returns to Block 505. When it is determined that no stages in the workflow remain (i.e., the well design is complete), the well design may be implemented (Block 535) in a field and then operated to extract hydrocarbons and other valuables (e.g., water, minerals, etc.).

Figure 6:
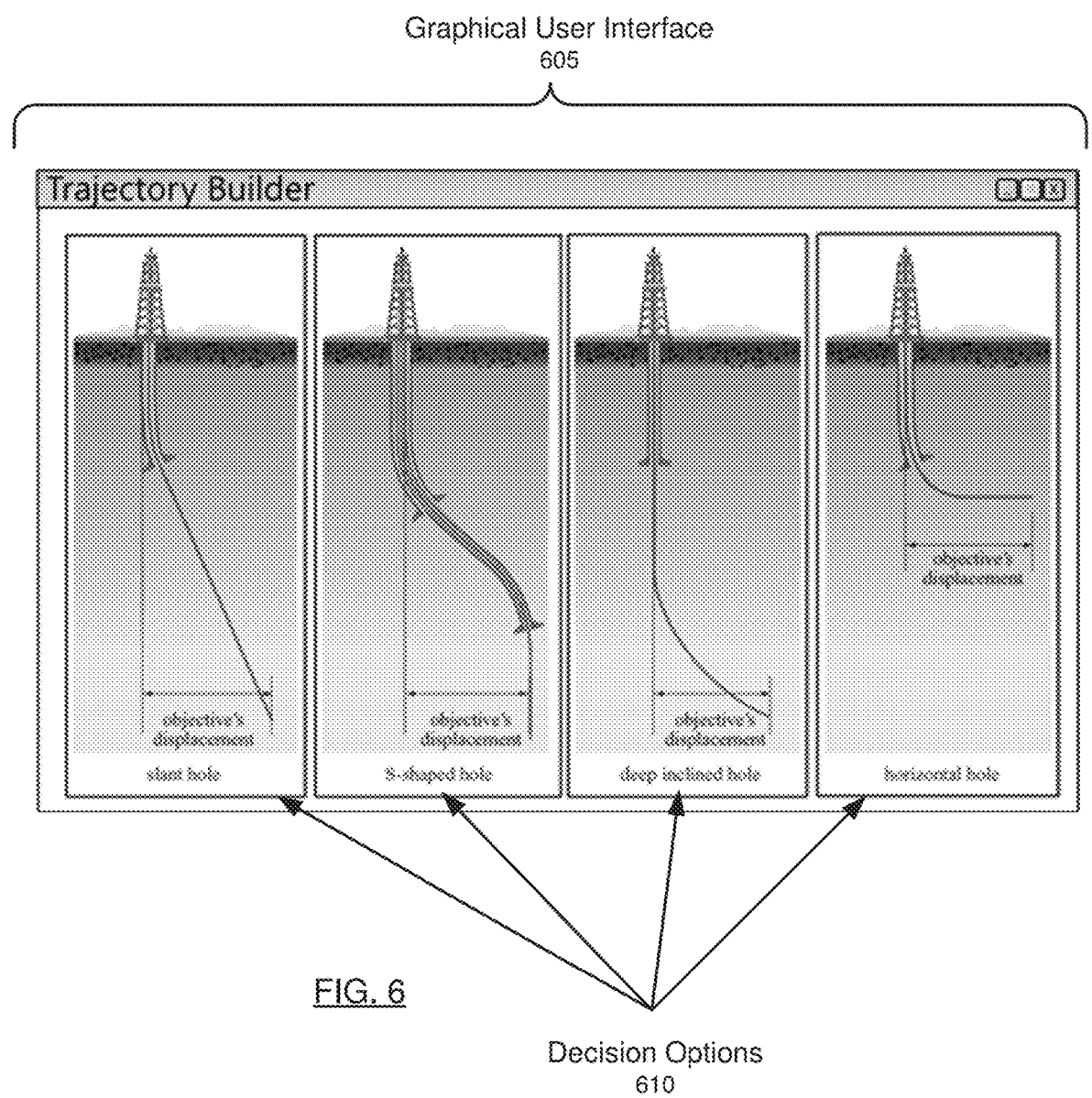
FIGS. 6 and 7 show examples in accordance with one or more embodiments.

FIG. 6 shows an example in accordance with one or more embodiments. Specifically, FIG. 6 shows a GUI (605) displayed to a participant having the participant with "Builder" authority within the trajectory well construction discipline. The GUI includes four decision options (610), specifically four canonical well trajectory configurations, from which the participant must select and then parameterize. For example, the participant may parameterize the well trajectory by specifying a deviation angle for a slanted hole. As another example, the participant may parameterize the well trajectory by specifying a kickoff depth for a horizontal well.

Figure 7:
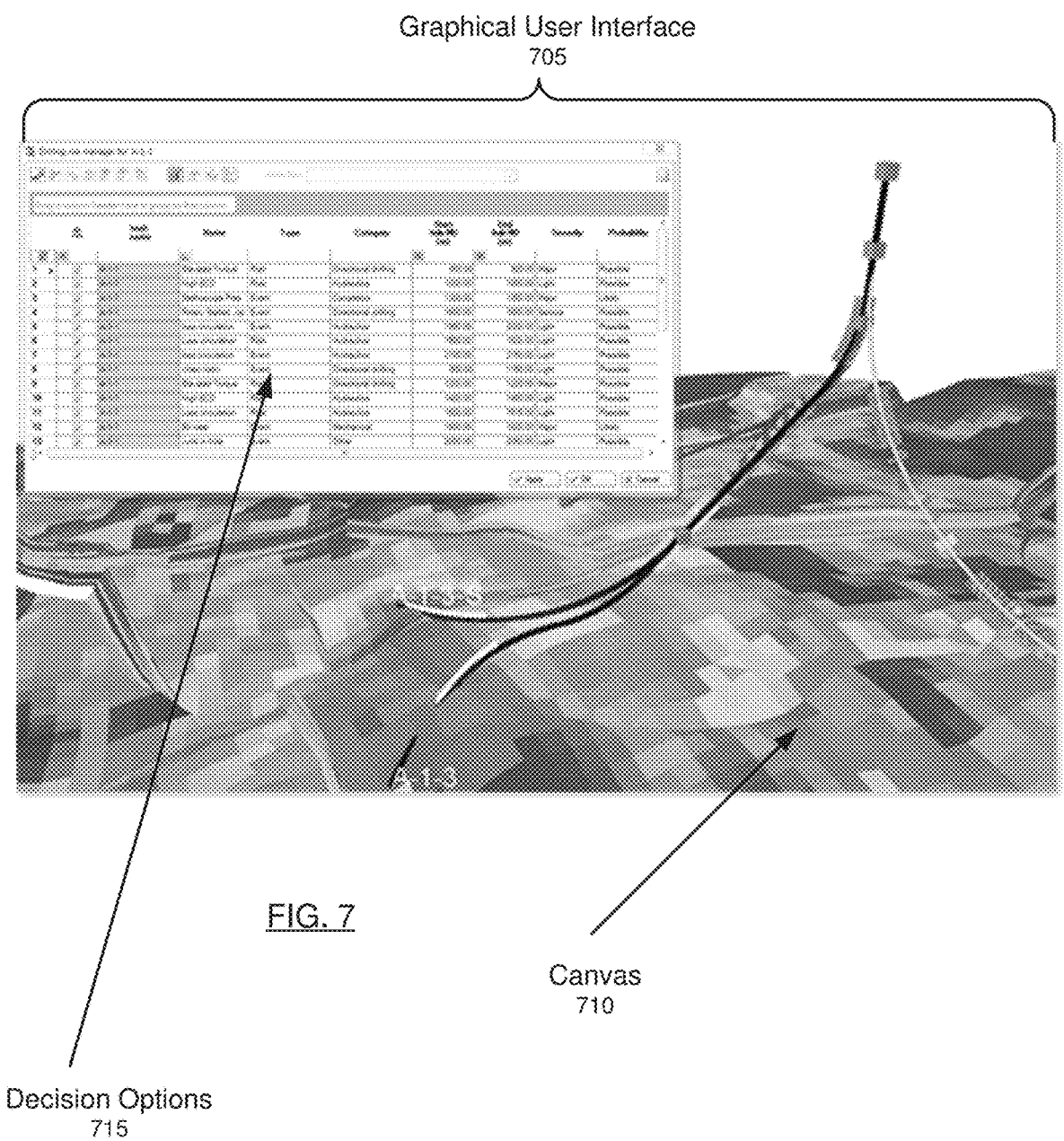

FIG. 7 shows an example in accordance with one or more embodiments. Specifically, FIG. 7 shows a GUI (705) displayed to a participant with the "Designer" authority level within the trajectory well construction discipline. The GUI (705) includes a canvas (710) where the participant can blueprint one or more aspects of the well design. The GUI (705) also includes decision options (715) in the form of a list. The participant may be required to select one or more elements on the list.

Figure 8:
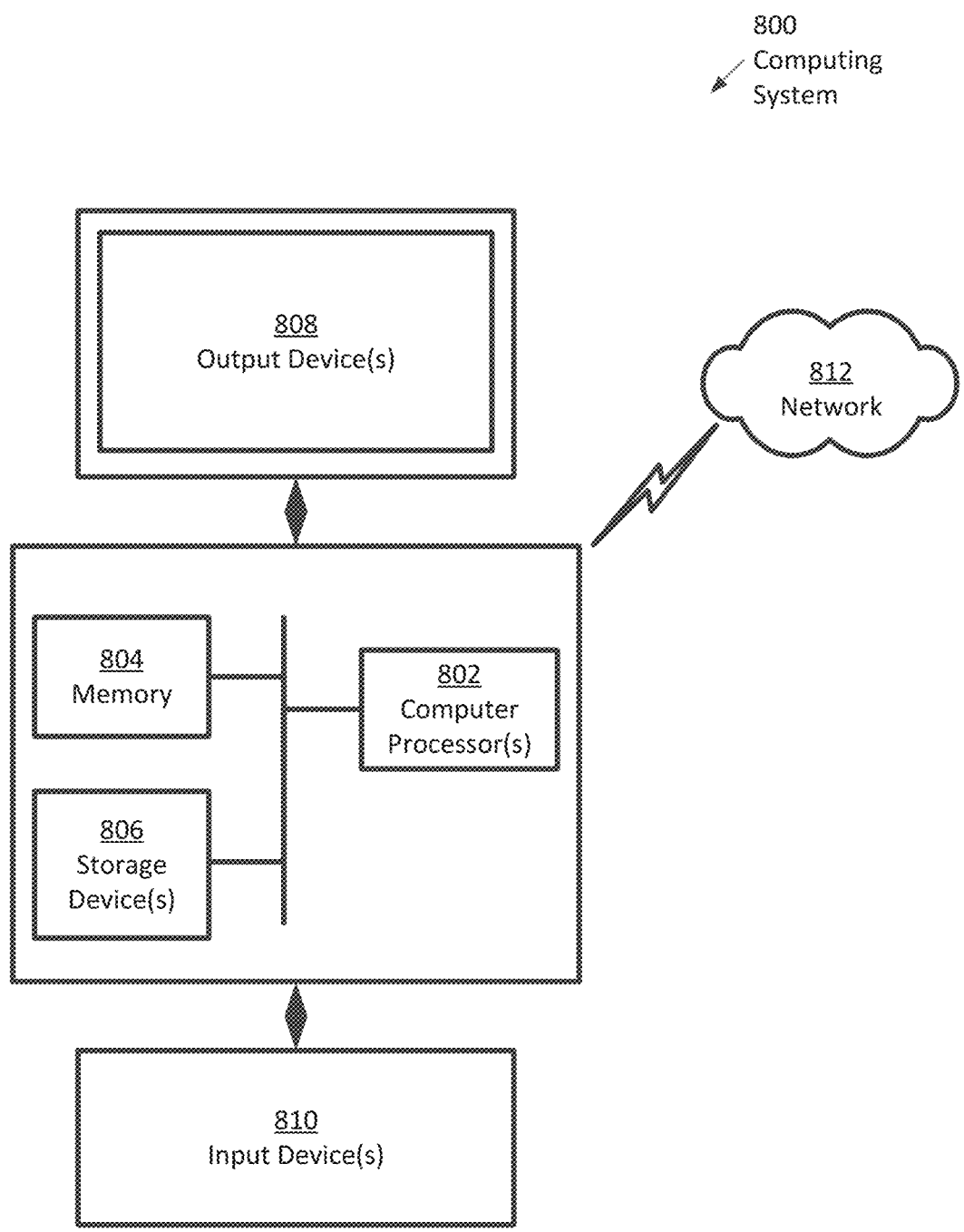
FIG. 8 shows a computer system in accordance with one or more embodiments.

In one or more embodiments, one or more of the components discussed above, including the components in FIG. 2, may be implemented as or execute on a computing system. The computing system may be combination of mobile, desktop, server, embedded, or other types of hardware. For example, as shown in FIG. 8, the computing system (800) may include one or more computer processor(s) (802), associated memory (804) (e.g., random access memory (RAM), cache memory, flash memory, etc.), one or more storage device(s) (806) (e.g., a hard disk, an optical drive such as a compact disk (CD) drive or digital versatile disk (DVD) drive, a flash memory stick, etc.), and numerous other elements and functionalities. The computer processor(s) (802) may be an integrated circuit for processing instructions. For example, the computer processor(s) may be one or more cores, or micro-cores of a processor. The computing system (800) may also include one or more input device(s) (810), such as a touchscreen, keyboard, mouse, microphone, touchpad, electronic pen, or any other type of input device. Further, the computing system (800) may include one or more output device(s) (808), such as a screen (e.g., a liquid crystal display (LCD), a plasma display, touchscreen, cathode ray tube (CRT) monitor, projector, or other display device), a printer, external storage, or any other output device. One or more of the output device(s) may be the same or different from the input device(s). The computing system (800) may be connected to a network (812) (e.g., a local area network (LAN), a wide area network (WAN) such as the Internet, mobile network, or any other type of network) via a network interface connection (not shown). The input and output device(s) may be locally or remotely (e.g., via the network (812)) connected to the computer processor(s) (802), memory (804), and storage device(s) (806). Many different types of computing systems exist, and the aforementioned input and output device(s) may take other forms.

Software instructions in the form of computer readable program code to perform embodiments of the present disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by a processor(s), is configured to perform embodiments of the present disclosure.

Further, one or more elements of the aforementioned computing system (800) may be located at a remote location and connected to the other elements over a network (812). Further, embodiments of the present disclosure may be implemented on a distributed system having a plurality of nodes, where each portion of the present disclosure may be located on a different node within the distributed system. In one embodiment of the present disclosure, the node corresponds to a distinct computing device. The node may correspond to a computer processor with associated physical memory. The node may correspond to a computer processor or micro-core of a computer processor with shared memory and/or resources.

While the present disclosure has been described with respect to a limited number of embodiments, those skilled in the art, having benefit of this disclosure, will appreciate that other embodiments can be devised which do not depart from the scope of the present disclosure as disclosed herein. Accordingly, the scope of the present disclosure should be limited only by the attached claims.

What is claimed is:

1. A method for designing a well, comprising:
determining a first well construction discipline for a first participant and an authority level for the first participant within the first well construction discipline;
obtaining a plurality of rules corresponding to the first well construction discipline and the authority level for the first participant within the first well construction discipline, wherein obtaining the plurality of rules comprises: accessing a multi-dimensional matrix comprising a first dimension corresponding to a plurality of authority levels and a second dimension corresponding to a plurality of well construction disciplines, wherein the multi-dimensional matrix comprises an entry comprising the plurality of rules;
operating, based on the plurality of rules, an interface that restricts decision options for the first participant;
receiving a decision associated with the well and based on the interface from the first participant; and
updating a design of the well based on the decision.

2. The method of claim 1, further comprising:
presenting one or more decision options to the first participant via the interface based on one or more decisions made by one or more other participants via the interface.

3. The method of claim 1, wherein the interface is a graphical user interface (GUI), and wherein operating the interface comprises:
modifying a plurality of graphical user interface (GUI) widgets in the GUI based on the plurality of rules, wherein the plurality of GUI widgets enables a selection of the decision options, and modifying the plurality of GUI widgets comprises changing a number or range of the decision options available for the selection, adding or removing one or more decision options available for the selection, or any combination thereof.

4. The method of claim 3, wherein the plurality of GUI widgets comprises one or more radio buttons, drop down lists, sliders, textboxes, or any combination thereof.

5. The method of claim 1, wherein the plurality of authority levels comprises a builder, wherein, for the builder, the interface comprises a parameterized design within the first well construction discipline, and wherein the decision comprises specification of a parameter value for the parameterized design.

6. The method of claim 5, wherein the plurality of authority levels comprises a selector, wherein, for the selector, the interface comprises a plurality of engineering decisions within the first well construction discipline, and wherein the decision comprises a selection of an engineering decision created by the builder.

7. The method of claim 6, wherein the plurality of authority levels comprises a validator, wherein, for the validator, the interface comprises a design decision within the first well construction discipline, and wherein the decision comprises a validation of the design decision.

8. The method of claim 6, wherein the plurality of authority levels comprises a coherency checker, wherein, for the coherency checker, the interface comprises a design decision within multiple well construction disciplines, and wherein the decision comprises a validation of the design decision.

9. The method of claim 6, wherein the plurality of authority levels comprises a designer, wherein, for the designer, the interface comprises a range of capabilities, and wherein the decision comprises using at least one of the capabilities.

10. The method of claim 9, wherein the plurality of authority levels comprises an optimizer, wherein, for the optimizer, the decision is a modification to an existing decision to optimize at least one selected from a group consisting of performance, cost, safety, and reliability of the existing decision.

11. The method of claim 1, further comprising:
collecting one or more decisions from each participant of a plurality of participants via the interface;
adding the one or more decisions to a collection of decisions in a design repository; and
obtaining one or more additional decisions from at least one of the plurality of participants via the interface based on the collection of decisions.

12. A system for designing a well, comprising:
an authority level repository storing a plurality of rules associated with a plurality of well construction disciplines and a plurality of authority levels, wherein the authority level repository comprises: a multi-dimensional matrix comprising a first dimension corresponding to the plurality of authority levels and a second dimension corresponding to the plurality of well construction disciplines, wherein the multi-dimensional matrix comprises an entry comprising a subset of the plurality of rules;
a design repository storing a design of the well; and
a workflow engine configured to: obtain a subset of the plurality of rules corresponding to a well construction discipline of a participant and an authority level for the participant within the well construction discipline;
generate, based on the subset of the plurality of rules, an interface that restricts decision options for the participant;
receive a decision associated with the design of the well and based on the interface from the participant; and
update the design of the well based on the decision.

13. The system of claim 12, wherein the interface is a graphical user interface (GUI) comprising a plurality of GUI widgets, wherein the plurality of GUI widgets enables a selection of the decision options, wherein the workflow engine is configured to modify the plurality of GUI widgets by changing a number or range of the decision options available for the selection, adding or removing one or more decision options available for the selection, or any combination thereof.

14. The system of claim 12, wherein the participant is at least one selected from a group consisting of an individual and an algorithm, and wherein the well construction discipline is at least one selected from a group consisting of well trajectory design, casing, fluid selection, bit design, and bottom hole assembly (BHA) design.

15. The system of claim 14, wherein the authority level is at least one selected from a group consisting of a selector, a validator, a coherency checker, a designer, an optimizer, and a builder.

16. A non-transitory computer-readable medium (CRM) storing instructions for designing a well, the instructions executable by a processor to:
determine a well construction discipline for a participant and an authority level for the participant within the well construction discipline;
obtain a plurality of rules corresponding to the well construction discipline and the authority level for the participant within the well construction discipline, wherein obtaining the plurality of rules comprises: accessing a multi-dimensional matrix comprising a first dimension corresponding to a plurality of authority levels and a second dimension corresponding to a plurality of well construction disciplines, wherein the multi-dimensional matrix comprises an entry comprising the plurality of rules;
operate, based on the plurality of rules, an interface that restricts decision options for the participant;
receive a decision associated with the well and based on the interface from the participant; and
update a design of the well based on the decision.

17. The non-transitory CRM of claim 16, wherein the participant is at least one selected from a group consisting of an individual and an algorithm, wherein the well construction discipline is at least one selected from a group consisting of well trajectory design, casing, fluid selection, bit design, and bottom hole assembly (BHA) design, and the plurality of authority levels comprise a selector, a validator, a coherency checker, a designer, an optimizer, and a builder.

18. The non-transitory CRM of claim 17, wherein the authority level is the builder, wherein the interface is a graphical user interface (GUI) comprising a parameterized design within the well construction discipline, and wherein the decision comprises specification of a parameter value for the parameterized design.

* * * * *